(12) United States Patent  
Miller

(10) Patent No.: US 10,373,881 B2  
(45) Date of Patent: Aug. 6, 2019

(54) DEFECT ANALYSIS

(71) Applicant: FEI Company, Hillsboro, OR (US)

(72) Inventor: Thomas G. Miller, Portland, OR (US)

(73) Assignee: FEI Company, Hillsboro, OR (US)

( * ) Notice: Subject to any disclaimer, the term of this patent is extended or adjusted under 35 U.S.C. 154(b) by 28 days.

(21) Appl. No.: 15/851,357

(22) Filed: Dec. 21, 2017

(65) Prior Publication Data

US 2018/0182676 A1 Jun. 28, 2018

Related U.S. Application Data

(60) Provisional application No. 62/437,615, filed on Dec. 21, 2016.

(51) Int. Cl.
*G01R 31/28* (2006.01)
*H01L 21/66* (2006.01)
*G01R 31/307* (2006.01)

(52) U.S. Cl.
CPC .......... *H01L 22/12* (2013.01); *G01R 31/2831* (2013.01); *G01R 31/307* (2013.01)

(58) Field of Classification Search
None
See application file for complete search history.

(56) References Cited

U.S. PATENT DOCUMENTS

| | | | |
|---|---|---|---|
| 6,566,654 B1* | 5/2003 | Funatsu | H01J 37/28 250/306 |
| 7,904,845 B2 | 3/2011 | Fouquet et al. | |
| 9,218,940 B1 | 12/2015 | Brogden | |
| 2001/0017878 A1* | 8/2001 | Nozoe | G01N 23/20 374/5 |
| 2007/0112533 A1 | 5/2007 | Tomimatsu et al. | |
| 2008/0016314 A1 | 1/2008 | Li et al. | |
| 2009/0242759 A1* | 10/2009 | Bray | G01R 31/307 250/307 |
| 2011/0049382 A1 | 3/2011 | Miller et al. | |
| 2013/0092826 A1 | 4/2013 | Miller et al. | |
| 2014/0007307 A1 | 1/2014 | Routh et al. | |
| 2014/0061032 A1 | 3/2014 | Miller et al. | |
| 2016/0141147 A1 | 5/2016 | Brogden et al. | |
| 2017/0256380 A1 | 9/2017 | Brogden et al. | |

FOREIGN PATENT DOCUMENTS

| | | |
|---|---|---|
| JP | 2000241319 A | 9/2000 |
| JP | 4091060 B2 | 5/2008 |
| JP | 4293201 B2 | 7/2009 |
| JP | 4365886 B2 | 11/2009 |
| JP | 4367433 B2 | 11/2009 |
| WO | 02075806 A1 | 9/2002 |

\* cited by examiner

*Primary Examiner* — Thien F Tran

(57) ABSTRACT

A system for analyzing defects comprises determining coordinates of a defect using a wafer inspection tool; identifying a structure of interest near the defect coordinates; directing a focused ion beam toward the wafer to expose the structure of interest; and forming an image of the exposed structure of interest, wherein the focused ion beam is directed to the mill at a location corresponding to the identified structure of interest rather than at the coordinates of the defect.

22 Claims, 3 Drawing Sheets

| Structure of Interest | FIB Operation |
|---|---|
| FinFET source region perpendicular to fin | Form TEM Lamella through the source region and having a plane perpendicular to the fin |
| FinFET source region parallel to fin | Form TEM Lamella through the source region and having a plane parallel to the fin |
| Fin structure | Mill cross section for SEM viewing parallel to Fin through fin center |
| Via cross section | Mill cross section for SEM viewing through center of via |

FIG. 3

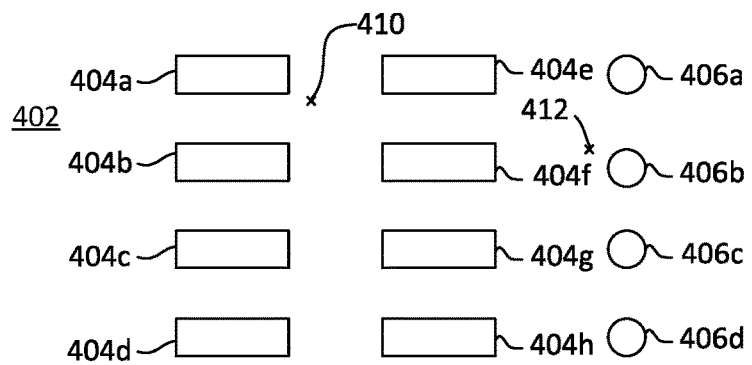

FIG. 4

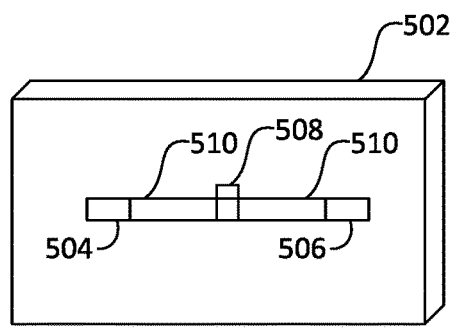

FIG. 5

DEFECT ANALYSIS

TECHNICAL FIELD OF THE INVENTION

The present invention relates to a method of analyzing defects in a sample, such as an integrated circuit.

BACKGROUND OF THE INVENTION

Modern integrated circuits include features having line widths that are smaller than 100 nm. Efficiently identifying and analyzing defects created during the fabrication of such circuits is an ongoing challenge.

Optical wafer inspection tools, such as KLA-Tencor 2930 Broadband Plasma Defect Inspection System from KLA-Tencor Corporation of Milpitas, Calif., optically examine wafers on which integrated circuits are fabricated. The wafers can be in various stages of processing or can be "deprocessed" to remove layers and expose buried layer. Optical wafer inspection tools illuminate the wafer under test and observe the light from the wafer surface and near subsurface to identify defects. The types of defects that are observable include physical defects on, near, or somewhat below the surface. The wafer inspection tool typically outputs a list of anomalies that may correspond to defects. The list can include a defect category and the positions of the defects in the inspection coordinate system. Defects on the wafer can be identified by comparing the results of the actual scan with the results of a scan of a known good wafer or by comparing the inspection results with a simulated inspection of a known good wafer. In some workflows, equipment after the inspection step is used to perform a mark of some sort on the wafer surface to so that the defect can be found more easily during later processing.

Another type of wafer inspection tool is a scanning electron microscope (SEM) inspection tool such as the Hermes eScan 320XP. An electron beam scans over the surface of the wafer and an image is formed using electrons emitted from the sample in response to the incoming beam. The coordinates of anomalies are noted. The electron beam can form a more highly magnified image of the anomaly. Such SEM-based inspection tools can see both physical defects or electrically related defects, referred to as voltage contrast (VC) defects. In many cases, VC defects or defects that are electrical in nature will be due to a defect that is physically below the wafer surface (i.e., a sub-surface defect).

Defects can also be identified from using other types of wafer inspection tools, such as an optical or thermal system like the ELITE for Semiconductors and probe systems, such as the Hyperion, both of which are available from FEI Company, part of Thermo Fisher Scientific Company, the assignee of the present invention.

Probe systems find defects by electrical probing of exposed conductors on the wafer surface. Defects are identified by electrical signatures from physical probes in contact with the wafer.

The identified defects are often below the surface of the wafer and it is often necessary to expose a buried layer to examine the defects. The coordinates of the defect may be transmitted from the wafer inspection tool to a focused ion beam (FIB) tool and the FIB mills the wafer to expose the defect available for analysis. In some scenarios, the transmission of coordinates might be performed by a factory automation system that coordinates and controls the operation of multiple systems.

To perform the sub-surface evaluation, the FIB may mill a trench in the wafer at the defect coordinates to expose a cross section of a region at the defect site. An image of the exposed cross section can then be viewed using an SEM. In some cases, additional thin slices are removed from the cross section and additional SEM images are formed to provide a series of images through a three-dimensional volume as the exposed wall progresses through the sample. Such a technique is described, for example, in U.S. Pat. No. 9,218,940 to Brogden for "Method and Apparatus for Slice and View Sample Imaging," which is assigned to the applicant of the present application.

The FIB tool may also be used to prepare a sample from the wafer to be viewed on a transmission electron microscope (TEM), which provides higher resolution than an SEM but which requires a sample that is sufficiently thin for electrons to pass through. As used herein, "TEM" include both a non-scanning TEM and a scanning transmission electron microscope (STEM) and a "TEM image" can include an image formed in either. A method of extracting a thin sample, referred to as a "lamella" from a wafer is described, for example, in U.S. Pat. App. Pub. 2016/0141147 of Brogden et al, for "Automated TEM Sample Preparation," which is assigned to the assignee of the present application. The extracted sample may be a cross-sectional sample from a plane perpendicular to the surface or a planar-view sample from a plane parallel to the wafer surface. A common feature of all of the described FIB methods is that the FIB is used to assist in some type of sub-surface evaluation at the location of the defect.

The wafer inspection tool provides defect coordinates in a wafer inspection tool coordinate system. To find the defects in the FIB tool, it is necessary to determine the location of the defect in the FIB tool coordinate system. The location of reference points on the wafer are determined in both the wafer inspection tool and in the FIB tool, and then a coordinate transformation system is calculated to transform the coordinates of the defects as determined in the wafer inspection tool to coordinate in the FIB tool. Reference points can include, for example, notches or flat regions in the wafer circumference, as well as marks produced on the wafer during the fabrication process or marks made specifically for alignment.

Modern integrated circuits can have transistors fabricated in array with a pitch of 50 nm or even smaller. To capture a transistor gate in a lamella as thin as 10 to 15 nm lamella requires precise positioning of the FIB beam to fabricate the lamella. In many cases, it is desirable to perform FIB milling with positional accuracy errors less than a few nanometers. This process of using the defect coordinates generated by the wafer inspection tool to position the focused ion beam for preparing an inspection site is inexact. The resolution of the optical inspection system is limited by the wavelength of the light used, and may not be sufficient to prepare the cross section or sample for viewing. Also, the mapping of the wafer inspection tool coordinate system to the FIB tool coordinate system may be inexact.

Typically, a cross section or lamella is prepared at the defect location determined by the coordinate transformation as part of the FIB processing. In practice, that location often misses the actual defect and so will not result in an image of the defect, depriving the process engineer of needed information.

SUMMARY OF THE INVENTION

An object of the invention is to provide a method and apparatus for analyzing defects in integrated circuits.

A defect is identified in an inspection tool. A structure of interest corresponding to the defect coordinates is or was previously determined. A processing tool, such as a FIB tool then exposes the structure of interest for analysis, and the structure is analyzed. The processing tool processes and exposes the identified structure of interest, typically the one nearest to the inspection tool defect coordinates rather than processing the sample at the coordinates of the defect.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIG. 3 shows a table specifying a structure of interest for different defect types.

FIG. 4 shows positions of structures in a wafer and defect locations;

FIG. 5 shows a TEM lamella in which elements of a FinFET are exposed;

DETAILED DESCRIPTION OF PREFERRED EMBODIMENTS

Figures 1, 2:
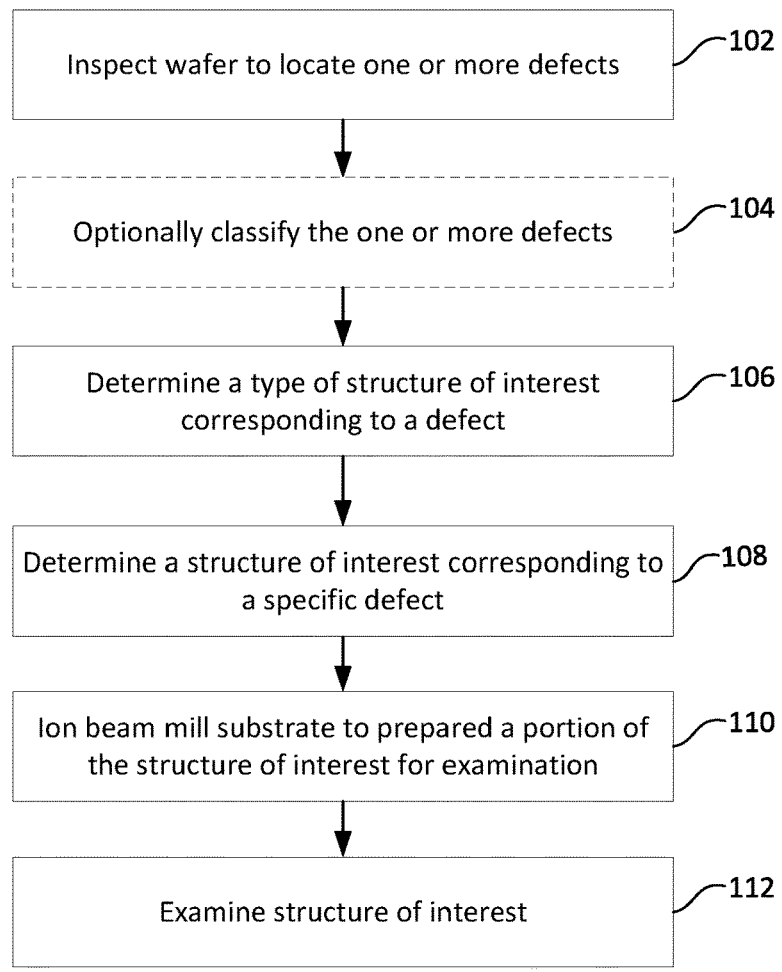
FIG. 1 is a flow chart showing a method of analyzing defects.
FIG. 2 shows an output file from a wafer inspection tool.

In traditional defect analysis, a FIB is used to cut into a wafer, i.e., mill, at a location corresponding to defect coordinates reported by an inspection tool and converted into the FIB tool coordinate system. The defect location reported by the wafer inspection tool and converted into the FIB tool coordinate system, however, is often insufficiently precise to allow FIB processing to expose the defect. Applicant has recognized that a structural defect observable in a wafer inspection tool is more likely to occur at the location of a structure, rather than between structures. Applicant has also recognized that a significant defect causes a malfunction of a circuit element, such as a transistor or a via, and the process engineer or other person analyzing the defect can gain more relevant information by analyzing the structure of interest in the defective circuit element. Applicant uses the defect coordinate from the wafer inspection tool to identify a nearby circuit or structural element, and then directs the FIB tool to process the desired circuit or structural element, rather than directing the FIB tool to mill at the defect coordinates. The position of the structure in the FIB tool coordinates provides a more precise position to mill than the defect coordinates from the wafer inspection tool that are converted into the FIB tool coordinates.

Inspection tools typically have automated classification capability by which they can bin detected defects into classes. In some embodiments, a process engineer can associate with one or more of the defect classes a FIB operation to create a "structure of interest" specific to a defect classification. For example, a process engineer may determine that for a "Class 3" defect, he would like to review a TEM image of a lamella centered on the source region of a FinFET transistor, with the major planes of the lamella perpendicular to the fin. When the wafer inspection identifies a Class 3 defect and provides its coordinates, the nearest (or otherwise specified relative to the defect coordinates) FinFET is located using one of the methods described below and the FIB tool is programmed to automatically produce a lamella with the specified orientation at the specified position. Different classes of defects can be associated with different structures of interest. FIB milling is performed not at the defect coordinates provided by the inspection tool, but at the location of a corresponding structure of interest. The structure of interest corresponding to a defect will typically be the structure of interest nearest to the defect coordinates, but this is not required. Any structure of interest can be specified, such as one displaced in a particular direction or at a particular distance from the defect coordinates.

More than a single structure of interest can be associated with a defect class. For example, a defect class may be associated with two structures, with the structures oriented differently, such as a lamella in the plan of the fin and a lamella normal to the plane of the fin, the lamellae being extracted from different transistors within a specified distance of the defect coordinates. When the wafer inspection tool does not automatically classify the defects, all defects would be treated the same.

In some scenarios, multiple structures of interest might be associated with a single defect class. In this case FIB processing would occur at whichever structure of interest was closest to the reported location.

The procedures described herein facilitate a fully automated work flow in which defects are automatically identified in the wafer inspection tool and then a FIB tool automatically processes a structure of interest corresponding to the identified defect.

FIG. 1 is a flowchart showing a process for analyzing a defect. In step 102, the wafer is inspected in a wafer inspection tool. The wafer inspection tool can be any type of system that finds anomalies or defects and provides the defect coordinates. For example, the wafer inspection tool can be an optical inspection system, such as a KLA-Tencor 2930 from KLA-Tencor, an e-beam inspection tool, such as Hermes eScan 320XP from Hermes Microvision of Hsinchu City, Taiwan, a thermal inspection system, such as the ELITE for Semiconductors, from FEI Company, the assignee of the present invention or an electrical inspection system, such as a probe-based system. The process is not limited to processing wafer having integrated circuits fabricated thereon—the defects can be on any substrate.

In optional step 104, the defects are classified. For example, defect classification may be based upon the physical location of the defect within the die, or the size of the defect. Most modern wafer inspection tools will automatically classify the defects identified. One type of output file from a wafer inspection tool is a KLA Results File, also known as a "KLARF" file.

FIG. 2 shows a simplified output file table 202 from a wafer inspection tool. Column 204 shows a sequential number identifying each defect. Column 206 and column 208 show the x- and y coordinates, respectively, of each defect in a wafer inspection tool coordinate system. The wafer inspection tool coordinate system may be any type of coordinate system, such as a rectangular coordinate system or a polar coordinate system that specifies an angle and a distance from a center of rotation. Column 210 specifies the classification of the defect.

In step 106, a type of "structure of interest" that corresponds to the defect is determined. The type of structure of interest may be pre-specified for different classes of defects. If defects are not classified, then a single structure of interest can be used for all defect types. FIG. 3 shows a table with structures of interest associated with different defect classes, and the associated FIB operation to expose the structure of interest for analysis. Typically, the determination of the type of structure of interest associated with a defect classification is typically done prior to beginning the wafer inspection, but can be done any time before FIB processing. The type of structure of interest associated with a defect classification can be changed, for example, as the process engineer examines some structures of interest and learns more about the cause of the defect.

In step 108, a specific structure of interest on the wafer is determined and associated with the specific defect coordinates. The specific structure of interest can be determined by the wafer inspection tool, by a separate computer, by a FIB tool computer, or by any other system. The specific structure of interest can be determined at any time between the determination of the defect coordinates and the beginning of ion beam processing. Once the specific structure of interest is determined, the location of the defect as determined by the inspection tool is no longer of primary interest. Once the FIB tool has determined the location of the structure of interest in the FIB coordinate system, all future FIB processing can be done making use of the structure of interest.

The structure of interest associated with the defect is typically the structure of interest of the desired type that is nearest to the defect coordinates. There are several ways that the specific structure of interest nearest the defect coordinates can be identified.

Although the structure of interest is typically below the surface, features that are visible on the surface can be used to navigate and identify the location of the subsurface feature. Subsurface features can be visible in an SEM image. In some cases, SEM incident electrons can penetrate a small amount into the surface and create an image with some content of the region near the surface. An SEM image can also view a subsurface feature after it is exposed by the FIB.

Reference images can be used for comparison and navigation. For example, a top surface or sub-surface reference image can be experimentally acquired prior to the inspection. Image recognition software can be trained on the reference image to locate the structure of interest in relation to structures visible on the image. The FIB tool can navigate to the defect coordinate and acquire a FIB or SEM image of the region. The image recognition software can compare the visible features in the acquired image with visible features from the reference image to identify the position of the structure of interest relative to the visible features.

Alternatively, a reference image can be synthetically generated using a CAD ("computer-aided design") database describing the circuit design. In some cases, the CAD data comprises polygons and requires an interpretation step to convert the polygons to physical structures that are recognizable in an image. The CAD data can provide the location of subsurface features relative to visible features.

In yet another alternative, the structure of interest nearest to the defect coordinates can be determined using CAD data that specifies the location of circuit elements and comparing those locations to the defect coordinates. When the nearest structure of interest is identified, the FIB tool can navigate to the position of the structure of interest as indicated by the CAD data. Optionally, after the FIB tool navigates to the coordinates of the structure of interest coordinates as determined by the CAD data, an image of the region can be acquired and the structure of interest more precisely located using the image.

FIG. 4 shows as an example a schematic of a wafer surface 402 having eight FinFETS 404a-404h in an array and four vias 406a-406d. The "X" indicated by reference number 410 represents the coordinates of a Class 2 defect as output from the wafer inspection tool and transformed into the FIB tool coordinate system. The system will then consult table 300 to determine that, for a Class 2 defect, the structure of interest is a FinFET source region cut parallel to the fin. The system determines the nearest FinFET, which is FinFET 404a.

In step 110, the FIB tool is directed to exposes the structure of interest associated with the defect classification. The position of the structure of interest in the FIB coordinate system was determined in step 108. In the example of FIG. 4, the FIB tool can automatically form a TEM lamella through the source region and having a plane parallel to the fin as determined by FIG. 3 for the Class 2 defect. FIG. 5 shows a TEM lamella 502 formed in step 110, showing the source 504, drain 506, gate 508, and fins 510. In some embodiments, the FIB determines where to start milling based on a top down image. In some embodiments, a top down image can provide an approximate location at which to begin processing of the structure of interest, and then an image can be formed of a cross section exposed by the FIB. The FIB can continue to remove slices from the cross-section wall to progress the wall through the substrate until the structure of interest is exposed, as determined, for example, by image recognition software, trained on a previous image acquired experimentally or simulated from CAD data. Methods for locating a feature on a wafer for FIB processing are known.

Figure 6A:
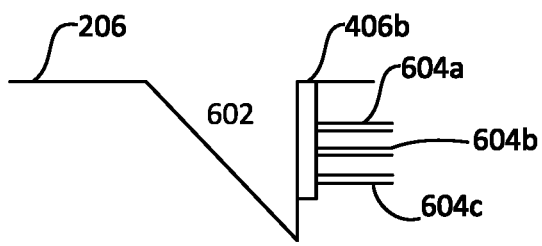
FIG. 6A and FIG. 6B show cross-sections of a via from a side view and a front view, respectively.
Figure 6B:
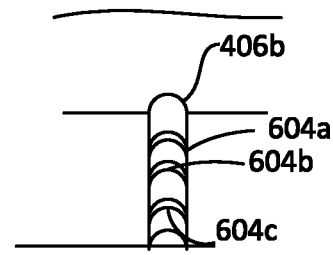

Defect 412 (FIG. 4) is a Class 4 defect. As shown in FIG. 3, the structure of interest associated with a Class 4 defect is a cross section of a via. The system locates the via closest to the coordinates of defect 412, in FIG. 4, via 406b. The FIB tool then positioned at via 406b and cuts a trench 602 to expose a cross section of via 406b as shown in FIG. 6A and FIG. 6B. Processing layers 604a, 604b, and 604c are visible in the cross section. In step 112, the structure of interest is examined.

FIG. 1 shows one possible order for carrying out the process steps. The order of performing the steps can be changed without departing from the scope of the invention.

A wafer inspection tool typically identifies a large number of defects, and it can be impractical to process each defect location with a FIB. Typically, a representative sample of defects is selected for further investigation. For example, a wafer inspection tool may inspect and identify, for example, 3000 defects with the defects being automatically classified into a number of classes. There system may select, for example, three defects from each specified class to be processed by the FIB tool. A user can pre-specify the number of defects for FIB processing for each class, and then the system can automatically select and process those defects.

Figure 7:
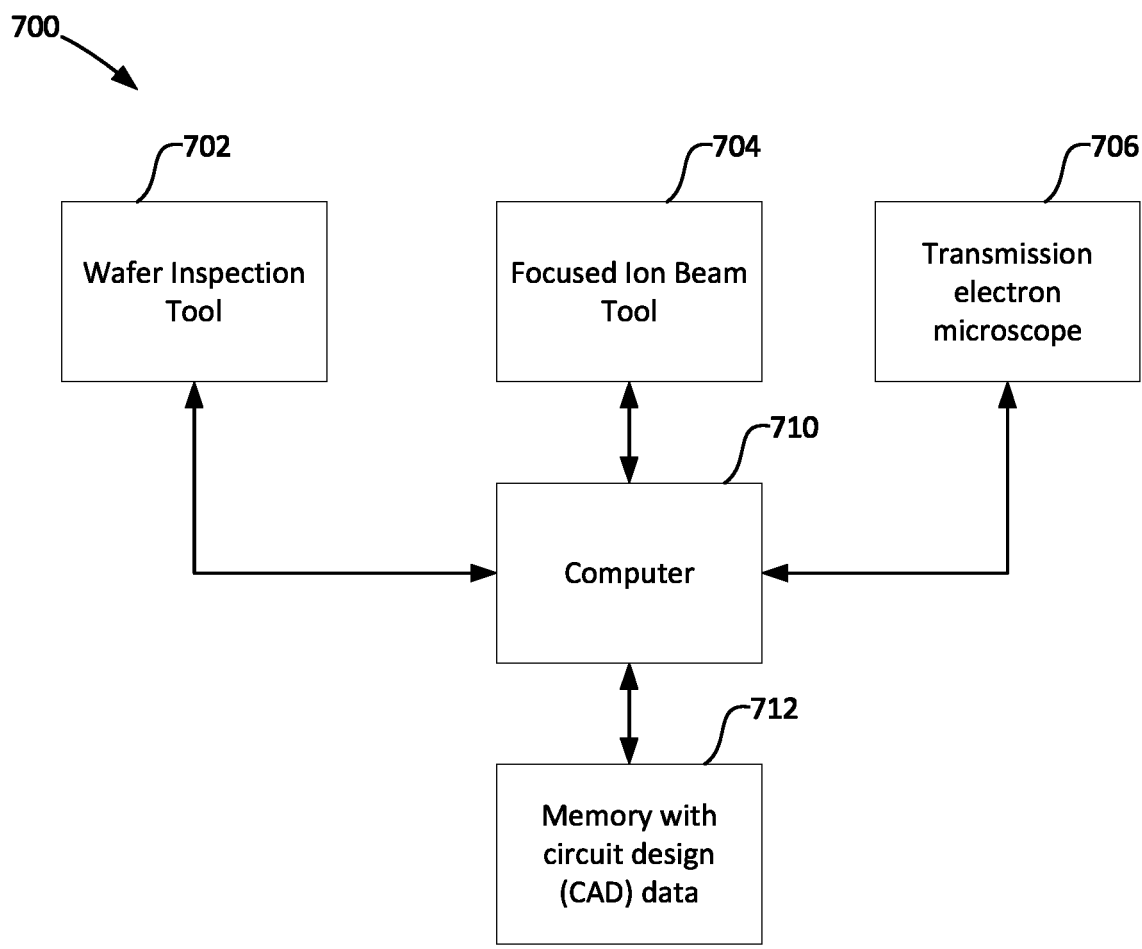
FIG. 7 shows schematically a system that can be used to implement the techniques described herein.

FIG. 7 shows a system 700 having major components including a wafer inspection tool 702, a FIB tool 704, a TEM 706, and a computer 710. The components may be in data communication through computer 710, which can control the components, although each of the components would also typically have its own controller. A memory 712 can store defect information, tables such as those shown in FIGS. 2 and 3, and design information (CAD data) that described the circuit of the wafer being inspected.

The term "defect coordinates" is understood to refer to the defect coordinates in the relevant system, that is, the FIB tool coordinate system or the inspection tool coordinate system. While "wafer inspection tools" are referenced above, the inspection tool may inspect the sample in any form and is not limited to samples in wafer form.

As used herein, a "FIB tool" includes, but is not limited to, a system having additional capabilities beyond directing a focused ion beam, such as a dual beam system having an SEM or a system that also includes an optical microscope. An example of a FIB tool would be the Helios Nanolab 1200 from FEI Company, Hillsboro, Oreg., a division of Thermo Fisher Scientific. A FIB tool can use any type of ion source, such as a liquid metal ion source or a plasma ion source.

Some embodiments of the invention provide a method for analyzing a circuit defect, comprising:

determining coordinates of a defect on a wafer using a wafer inspection tool;

identifying a structure of interest near the defect coordinates;

directing a focused ion beam toward the wafer to fabricate a TEM lamella including the structure of interest; and directing an electron beam toward the lamella to form a TEM image of the structure of interest, wherein the focused ion beam is directed to mill at a location corresponding to the identified structure of interest rather than at the coordinates of the defect.

Some embodiments of the invention provide a method for analyzing a circuit defect, comprising:

determining coordinates of a defect on a wafer using a wafer inspection tool;

identifying a structure of interest near the defect coordinates;

directing a focused ion beam toward the wafer to expose the structure of interest; and forming an image of the exposed structure of interest, wherein the focused ion beam is directed to mill at a location corresponding to the identified structure of interest rather than at the coordinates of the defect.

In some embodiments, directing the focused ion beam toward the wafer to expose the structure of interest comprises directing a focused ion beam toward the wafer to mill a cross section exposing the structure of interest; and forming the image of the exposed structure of interest comprises forming a scanning electron beam image.

In some embodiments, directing the focused ion beam toward the wafer to expose the structure of interest comprises directing a focused ion beam toward the wafer to form a lamella including the structure of interest.

In some embodiments, forming the image of the exposed structure of interest comprises forming a transmission electron beam image.

In some embodiments, determining the defect coordinate in the wafer inspection tool comprises determining a defect coordinate in an optical inspection system, a thermal inspection system, an electrical inspection system, or an electron beam inspection system.

In some embodiments, identifying the structure of interest near the defect coordinates comprises identifying the structure of interest nearest to the defect coordinates.

Some embodiments further comprise specifying entering a type of structure of interest and in which identifying the structure of interest nearest the defect coordinates comprises a structure of interest of the specified type.

In some embodiments, identifying the structure of interest of the specified type comprises identifying the structure of interest of the specified type nearest the defect coordinates.

In some embodiments, identifying the structure of interest near the defect coordinates comprises using stored circuit design data to identify a structure of interest near the defect coordinates.

In some embodiments, identifying the structure of interest near the defect coordinates comprises using an image to identify a structure of interest near the defect coordinates.

In some embodiments, identifying a structure of interest is performed by a wafer inspection tool, an ion beam system, or a computer in data communication with the wafer inspection tool and the ion beam system.

Some embodiments of the invention provide an apparatus for analyzing defects in an integrated circuit, comprising:

a wafer analysis tool programmed to identify defects on a wafer and to provide coordinates of the defects;

a dual beam system including a focused ion beam column and a scanning electron microscope column, the dual beam system programmed to perform an operation to expose a subsurface region of interest; and a computer programmed to receive defect coordinates from the wafer analysis tool, determine a structure of interest corresponding to the defect and direct the dual beam system to perform a specified operation to expose the subsurface region of interest.

In some embodiments, the wafer analysis tool classifies the defects and the specified operation depends on the classification.

In some embodiments, the wafer analysis tool is an optical inspection tool, a thermal inspection system, and electrical inspection system, or an electron beam inspection tool.

In some embodiments, the focused ion beam column comprises a liquid metal ion source or a plasma ion sources.

Some embodiments provide a method for analyzing a circuit defect, comprising:

inspecting a sample using an inspection tool that inspects an area of a sample, the area including more than 100 structures;

identifying a structure of interest near the defect coordinates;

directing a focused beam to expose the structure of interest; and forming an image of the exposed structure of interest, wherein the focused beam is directed to mill at location corresponding to the identified structure of interest rather than at the coordinates of the defect.

The techniques described herein are not limited to any particular type of sample, any particular type of inspection system, or any particular type of processing to expose the structure of interest. The sample being inspected is not limited to a wafer—any type of substrate on which multiple structures are fabricated can be used. The removal of material to expose the structure of limited is not limited to focused ion beam milling. For example, a laser can be used to expose the structure of interest. The techniques described herein are useful for any inspection system that inspects a relatively large area compared to the area of the structures of interest. For example, the area inspected by the inspection system may contain more than 1,000,000 or more than 100,000,000 fabricated structures and the area inspected may be more than 1,000,000 times, more than 10,000,000 times, or more than 500,000,000 times larger than the average area of individual structures.

The order of the steps in the claims below is not limiting—the order of the steps can be changed without departing from the scope of the claims.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method for analyzing a circuit defect, comprising:
   determining coordinates of a defect on a wafer using a wafer inspection tool;
   identifying a structure of interest near the defect coordinates;
   forming, with an ion beam, a transmission electron microscope (TEM) lamella that includes the structure of interest, wherein the TEM lamella is formed from an area based on the identified structure rather than the coordinates of the defect, and wherein the ion beam is directed to mill at a location corresponding to the identified structure of interest rather than at the coordinates of the defect; and
   forming a TEM image of the structure of interest.

2. The method of claim 1, wherein determining the coordinates of the defect on the wafer using the wafer inspection tool comprises determining the coordinates of the defect in an optical inspection system, a thermal inspection system, an electrical inspection system, or an electron beam inspection system.

3. The method of claim 2 in which identifying the structure of interest near the defect coordinates comprises using stored circuit design data to identify a structure of interest near the defect coordinates.

4. The method of claim 2 in which identifying the structure of interest near the defect coordinates comprises using an image to identify a structure of interest near the defect coordinates.

5. The method of claim 1 in which identifying the structure of interest near the defect coordinates comprises identifying the structure of interest nearest to the defect coordinates.

6. The method of claim 1 further comprising specifying a type of structure of interest and in which identifying the structure of interest nearest the defect coordinates comprises a structure of interest of the specified type.

7. The method of claim 6 in which identifying the structure of interest of the specified type comprises identifying the structure of interest of the specified type nearest the defect coordinates.

8. A method for analyzing a circuit defect, comprising:
   determining coordinates of a defect on a wafer using a wafer inspection tool;
   identifying a structure of interest near the defect coordinates;
   directing a focused ion beam toward the wafer to expose the structure of interest, wherein the focused ion beam is directed to mill at a location corresponding to the identified structure of interest rather than at the coordinates of the defect; and
   forming an image of the exposed structure of interest.

9. The method of claim 8 in which:
   directing the focused ion beam toward the wafer to expose the structure of interest comprises directing a focused ion beam toward the wafer to mill a cross section exposing the structure of interest; and
   forming the image of the exposed structure of interest comprises forming a scanning electron beam image.

10. The method of claim 8 in which directing the focused ion beam toward the wafer to expose the structure of interest comprises directing a focused ion beam toward the wafer to form a lamella including the structure of interest.

11. The method of claim 10 in which forming the image of the exposed structure of interest comprises forming a transmission electron beam image.

12. The method of claim 8 in which determining the defect coordinate in the wafer inspection tool comprises determining a defect coordinate in an optical inspection system, a thermal inspection system, an electrical inspection system, or an electron beam inspection system.

13. The method of claim 8 in which identifying the structure of interest near the defect coordinates comprises identifying the structure of interest nearest to the defect coordinates.

14. The method of claim 8 further comprising specifying a type of structure of interest and in which identifying the structure of interest near the defect coordinates comprises a structure of interest of the specified type.

15. The method of claim 14 in which identifying the structure of interest near the defect comprises identifying the structure of interest of the specified type near the defect coordinates.

16. The method of claim 8 in which identifying the structure of interest near the defect coordinates comprises using stored circuit design data to identify a structure of interest near the defect coordinates.

17. The method of claim 8 in which identifying the structure of interest near the defect coordinates comprises using an image to identify a structure of interest near the defect coordinates.

18. The method of claim 8 in which identifying a structure of interest is performed by a wafer inspection tool, an ion beam system, or a computer in data communication with the wafer inspection tool and the ion beam system.

19. An apparatus for analyzing defects in an integrated circuit, comprising:
   a wafer analysis tool programmed to identify defects on a wafer and to provide coordinates of the defects;
   a dual beam system including a focused ion beam column and a scanning electron microscope column, the dual beam system programmed to perform an operation to expose a subsurface region of interest; and
   a computer programmed to receive defect coordinates from the wafer analysis tool, determine a structure of interest within the subsurface region of interest corresponding to the defect and direct the dual beam system to perform a specified operation to expose the subsurface region of interest.

20. The apparatus of claim 19 in which the wafer analysis tool classifies the defects and the specified operation depends on the classification.

21. The apparatus of claim 19 in which the wafer analysis tool is an optical inspection tool, a thermal inspection system, and electrical inspection system, or an electron beam inspection tool.

22. The apparatus of claim 19 in which the focused ion beam column comprises a liquid metal ion source or a plasma ion sources.

* * * * *